(12) United States Patent
Long

(10) Patent No.: US 7,213,347 B2
(45) Date of Patent: May 8, 2007

(54) METERING MATERIAL TO PROMOTE RAPID VAPORIZATION

(75) Inventor: Michael Long, Hilton, NY (US)

(73) Assignee: Eastman Kodak Company, Rochester, NY (US)

( * ) Notice: Subject to any disclaimer, the term of this patent is extended or adjusted under 35 U.S.C. 154(b) by 204 days.

(21) Appl. No.: 11/120,330

(22) Filed: May 3, 2005

(65) Prior Publication Data

US 2006/0251810 A1 Nov. 9, 2006

(51) Int. Cl.
*F26B 19/00* (2006.01)
(52) U.S. Cl. .................... 34/61; 34/68; 427/248.1; 118/726
(58) Field of Classification Search .......... 34/61, 34/68; 427/248.1; 118/726
See application file for complete search history.

(56) References Cited

U.S. PATENT DOCUMENTS

| | | | |
|---|---|---|---|
| 2,447,789 A | | 8/1948 | Barr |
| 4,249,674 A | * | 2/1981 | Antenore ............... 222/153.11 |
| 4,769,292 A | | 9/1988 | Tang et al. |
| 4,885,211 A | | 12/1989 | Tang et al. |
| 6,037,241 A | * | 3/2000 | Powell et al. ............. 438/479 |
| 6,291,031 B1 | * | 9/2001 | Okazaki et al. ........... 427/593 |
| 7,165,340 B2 | * | 1/2007 | Long et al. .................... 34/61 |
| 2003/0051728 A1 | * | 3/2003 | Lloyd et al. ........... 128/203.26 |
| 2004/0099269 A1 | * | 5/2004 | Hale et al. ............ 128/203.16 |
| 2006/0062920 A1 | * | 3/2006 | Long et al. ............. 427/255.6 |
| 2006/0062929 A1 | * | 3/2006 | Kittle et al. ................ 427/475 |

FOREIGN PATENT DOCUMENTS

| | | |
|---|---|---|
| GB | 1122577 | 8/1968 |
| WO | WO 99/42634 | 8/1999 |
| WO | WO 2006/083734 | 8/2006 |
| WO | WO 2006/083735 | 8/2006 |

* cited by examiner

*Primary Examiner*—S. Gravini
(74) *Attorney, Agent, or Firm*—Raymond L. Owens

(57) ABSTRACT

Apparatus for vaporization of powdered or granular material, includes a container for holding powdered or granular material having at least one component; a vaporization structure; and a positive displacement mechanism spaced from the vaporization structure defining a chamber for receiving powdered or granular material from the container, and delivering such powdered or granular material to the vaporization structure, the positive displacement mechanism defining an orifice for delivering powdered or granular material from the chamber to the vaporization structure, an actuable member movable in first and section directions into the orifice and back from the orifice to be spaced therefrom for driving powdered or granular material from the chamber through the orifice for delivery to the vaporization structure and a vibratory diaphragm for fluidized material in the chamber between the actuable member and the orifice.

5 Claims, 3 Drawing Sheets

METERING MATERIAL TO PROMOTE RAPID VAPORIZATION

Reference is made to commonly assigned U.S. patent application Ser. No. 10/784,585 filed Feb. 23, 2004 by Michael Long et al, entitled "Device and Method for Vaporizing Temperature Sensitive Materials", U.S. patent application Ser. No. 10/945,941 filed Sep. 21, 2004 by Michael Long et al, entitled "Delivering Organic Powder to a Vaporization Zone", U.S. patent application Ser. No. 11/050,934 filed Feb. 4, 2005, by Michael Long et al, entitled "Feeding Organic Material to a Heated Surface", U.S. patent application Ser. No. 11/121,242 filed concurrently herewith, by Michael Long et al, entitled "Controllably Feeding Powdered Or Granular Material" the disclosures of which are herein incorporated by reference.

FIELD OF THE INVENTION

The present invention relates to the field of physical vapor deposition where material is heated to a temperature causing rapid vaporization, and create a vapor plume that condenses to form a thin film on a surface of a substrate.

BACKGROUND OF THE INVENTION

An organic light emitting diode (OLED) device includes a substrate, an anode, a hole-transporting layer made of an organic compound, an organic luminescent layer with suitable dopants, an organic electron-transporting layer, and a cathode. OLED devices are attractive because of their low driving voltage, high luminance, wide-angle viewing and capability for full-color flat emission displays. Tang et al. described this multilayer OLED device in their U.S. Pat. Nos. 4,769,292 and 4,885,211.

Physical vapor deposition in a vacuum environment is the principal means of depositing thin organic material films as used in small molecule OLED devices. Such methods are well known, for example Barr in U.S. Pat. No. 2,447,789 and Tanabe et al. in EP 0 982 411. The organic materials used in the manufacture of OLED devices are often subject to degradation when maintained at or near the desired rate-dependent vaporization temperature for extended periods of time. Exposure of sensitive organic materials to higher temperatures can cause changes in the structure of the molecules and associated changes in material properties.

To overcome the thermal sensitivity of these materials, only small quantities of organic materials have been loaded in sources and they are heated as little as possible. In this manner, the material is consumed before it has reached the temperature exposure threshold to cause significant degradation. The limitations with this practice are that the available vaporization rate is very low due to the limitation on heater temperature, and the operation time of the source is very short due to the small quantity of material present in the source. In the prior art, it has been necessary to vent the deposition chamber, disassemble and clean the vapor source, refill the source, reestablish vacuum in the deposition chamber and degas the just-introduced organic material over several hours before resuming operation. The low deposition rate and the frequent and time consuming process associated with recharging a source has placed substantial limitations on the throughput of OLED manufacturing facilities.

A secondary consequence of heating the entire organic material charge to roughly the same temperature is that it is impractical to mix additional organic materials, such as dopants, with a host material unless the vaporization behavior and vapor pressure of the dopant is very close to that of the host material. This is generally not the case and as a result, prior art devices frequently require the use of separate sources to co-deposit host and dopant materials.

A consequence of using single component sources is that many sources are required in order to produce films containing a host and multiple dopants. These sources are arrayed one next to the other with the outer sources angled toward the center to approximate a co-deposition condition. In practice, the number of linear sources used to co-deposit different materials has been limited to three. This restriction has imposed a substantial limitation on the architecture of OLED devices, increases the necessary size and cost of the vacuum deposition chamber and decreases the reliability of the system.

Additionally, the use of separate sources creates a gradient effect in the deposited film where the material in the source closest to the advancing substrate is over represented in the initial film immediately adjacent the substrate while the material in the last source is over represented in the final film surface. This gradient co-deposition is unavoidable in prior art sources where a single material is vaporized from each of multiple sources. The gradient in the deposited film is especially evident when the contribution of either of the end sources is more than a few percent of the central source, such as when a co-host is used.

A further limitation of prior art sources is that the geometry of the interior of the vapor manifold changes as the organic material charge is consumed. This change requires that the heater temperature change to maintain a constant vaporization rate and it is observed that the overall plume shape of the vapor exiting the orifices can change as a function of the organic material thickness and distribution in the source, particularly when the conductance to vapor flow in the source with a full charge of material is low enough to sustain pressure gradients from non-uniform vaporization within the source. In this case, as the material charge is consumed, the conductance increases and the pressure distribution and hence overall plume shape improve.

SUMMARY OF THE INVENTION

It is therefore an object of the present invention to provide an effective way to vaporize powders.

This object is achieved by an apparatus for vaporization of powdered or granular material, comprising:

(a) a container for holding powdered or granular material having at least one component;

(b) a vaporization structure; and (c) a positive displacement mechanism spaced from the vaporization structure defining a chamber for receiving powdered or granular material from the container, and delivering such powdered or granular material to the vaporization structure, the positive displacement mechanism defining an orifice for delivering powdered or granular material from the chamber to the vaporization structure, an actuable member movable in first and second directions into the orifice and back from the orifice respectively therefrom for driving powdered or granular material from the chamber through the orifice for delivery to the vaporization structure and a vibratory diaphragm for fluidizing material in the chamber between the actuable member and the orifice.

It is an advantage of the present invention that it overcomes the heating and volume limitations of prior art devices in that material is continuously dispensed into a source such that only a small portion of organic material is heated to the desired rate-dependant vaporization temperature, for a short period of time and at a controlled rate. The bulk of organic material is maintained at a temperature that is as much as 300° C. cooler than the vaporization temperature. It is therefore a feature of the present invention to maintain a steady vaporization rate with a continuously replenished accurately metered charge of material and with a steady heater temperature. The invention permits extended operation of the apparatus with substantially reduced risk of degrading even very temperature-sensitive organic materials. This feature additionally permits materials having different vaporization rates and degradation temperature thresholds to be co-vaporized.

It is a further advantage of the present invention that it permits linear vaporization rate control by controlling the volumetric metering rate of the compacted organic material powder.

It is a further advantage of the present invention that it can rapidly stop and reinitiate vaporization and achieve a steady vaporization rate quickly by controlling the metering rate of the organic material. This feature minimizes contamination of the deposition chamber walls and conserves the organic materials when a substrate is not being coated.

It is a further advantage that the present device achieves substantially higher vaporization rates than in prior art devices with substantially reduced material degradation. Further still, no heater temperature change is required as the source material is consumed.

It is a further advantage of the present invention that it can provide a vapor source in any orientation, which is not possible with prior-art devices.

DETAILED DESCRIPTION OF THE INVENTION

Figure 1:
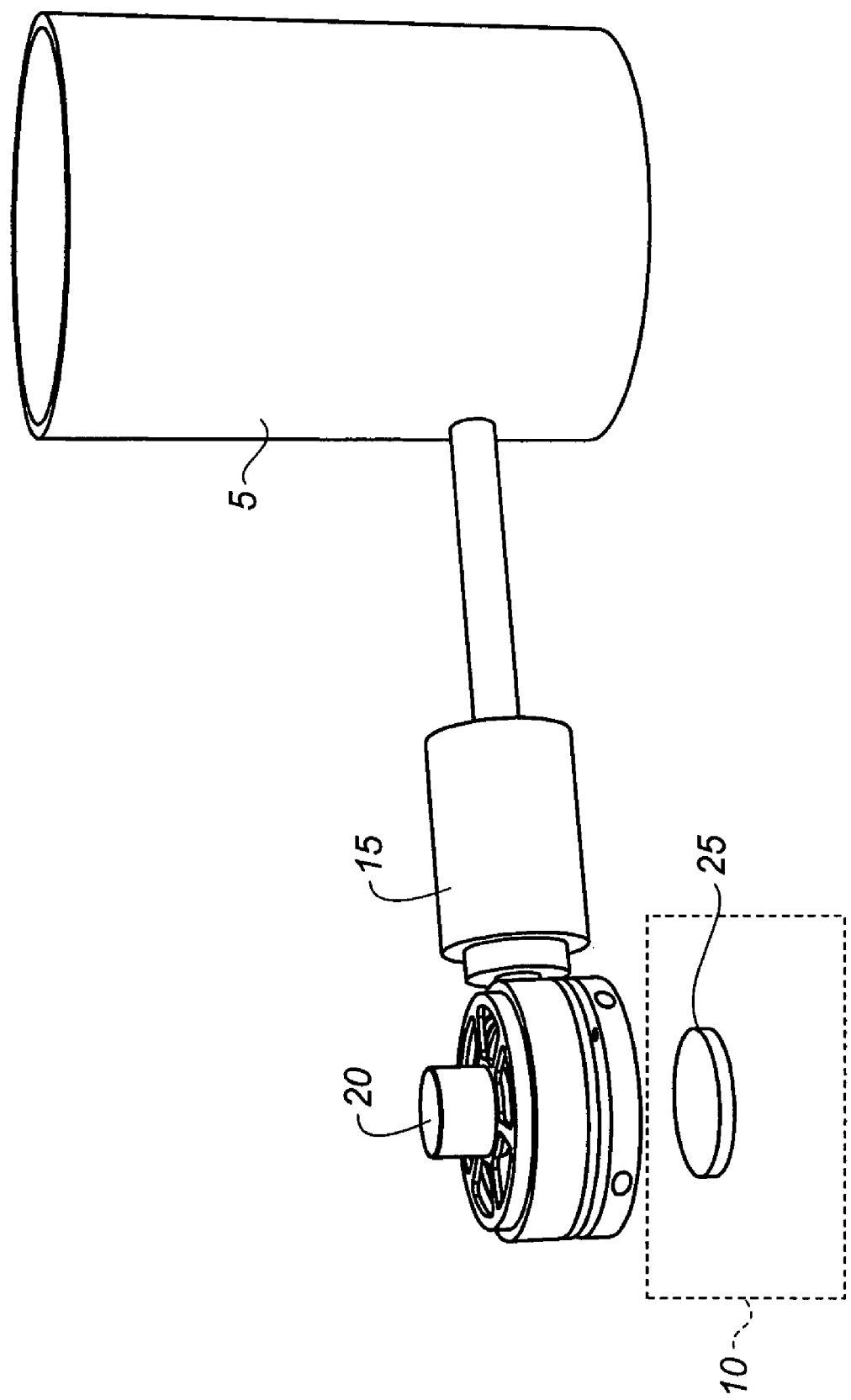
FIG. 1 illustrates a schematic of a first embodiment of the invention.

Turning now to FIG. 1, a container 5 is provided and holds a powdered or granular material. This material may be a single component or in alternative embodiments it may contain multiple components. The material can be powdered or granular. The container 5 can be provided with a structure for agitating or fluidizing the material (not visible in figure). There are many well known ways for providing this functionality; the use of a horizontal auger is particularly common. Alternatively, the container 5 may be vibrated by actuators attached to the walls of the container 5. A vaporization zone 10 is provided in a manner that is thermally isolated from the container 5 which contains the powdered or granular material. By thermally isolating the vaporization zone 10 from the container 5, the contents of the container 5 are protected from an elevation in temperature which may lead to degradation. The embodiment in FIG. 1 uses distance to achieve thermal isolation. However, other ways may be utilized such as thermal barriers constructed of thermally insulating materials or active cooling of the container 5. A screw mechanism 15 (see FIG. 2) transports fluidized material from the container 5 to a positive displacement mechanism 20. The positive displacement mechanism 20 receives a controllable amount of material from the container 5 via the screw and repeatably delivers that controlled or metered amount of material to the vaporization zone 10. The vaporization zone 10 contains a heated plate 25 for flash evaporating the material received from the positive displacement mechanism 20. In this embodiment, the heated plate 25 provides the energy for flash vaporizing the received material.

Figure 2:
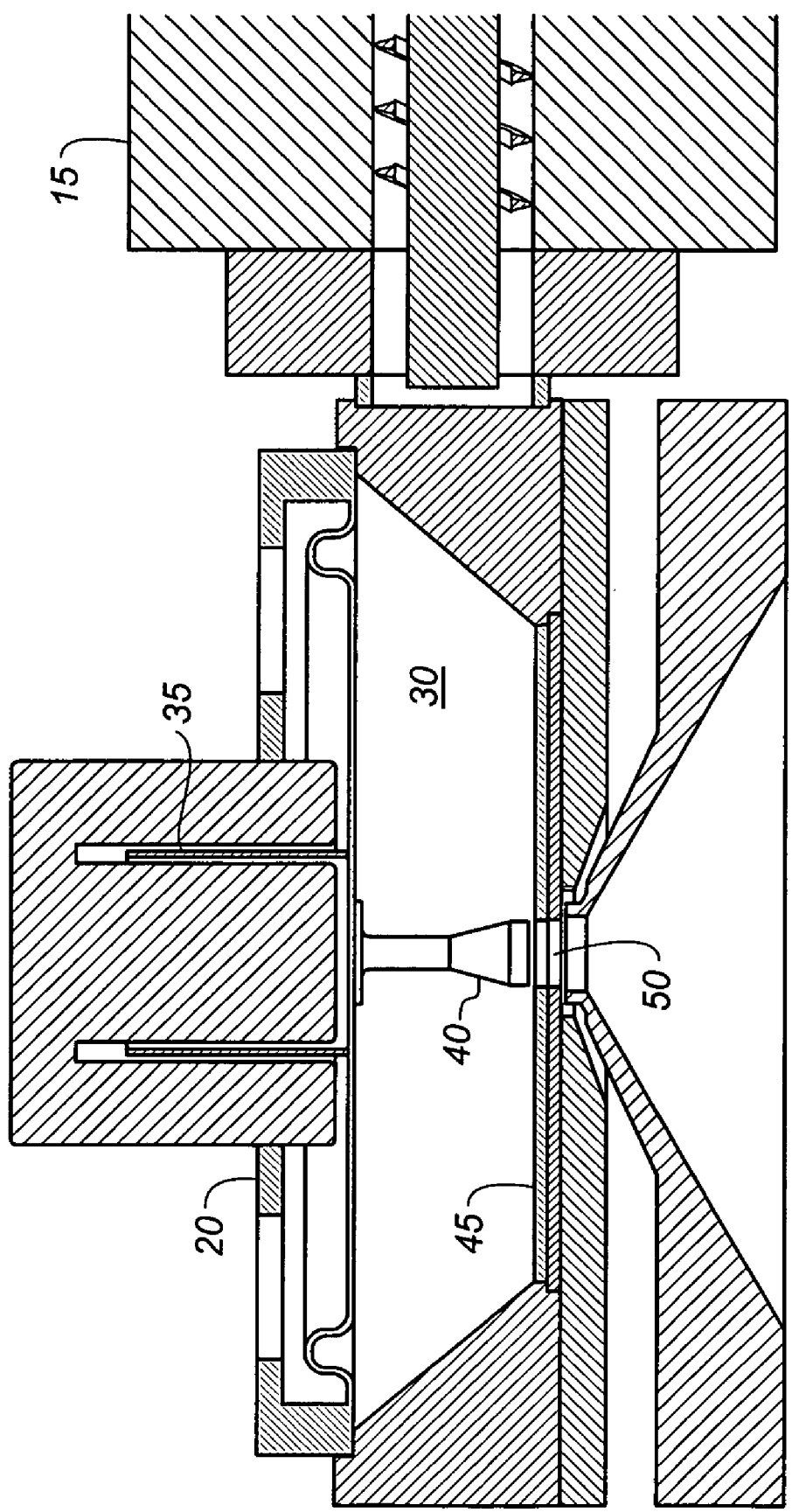
FIG. 2 is a cross-sectional view of a detail of the embodiment in FIG. 1.

Turning now to FIG. 2, a detailed view of the positive displacement mechanism 20 is shown in cross-section. The screw mechanism 15 feeds fluidized material from the container 5 (see FIG. 1) into a chamber 30 defined by the housing of the positive displacement mechanism 20. A piezo-actuated vibratory diaphragm 45 maintains the material in the chamber 30 in an agitated or fluidized state. A member shown as a piston 40 is actuable by an electrical coil 35. The piston 40 is located above and coaxially with an orifice 50. Actuation of the coil 35 causes the piston 40 to move up and down in response to current flow in different directions in the coil 35. Current in the coil 35 sets up a magnetic field that exerts forces on the piston 40. When the piston 40 is moved upward, the vibration of the diaphragm 45 will cause a quantity of material to occupy the volume vacated by the piston 40. A change in current flow to the coil 35 will drive the piston 40 downward, which in turn will drive the material in the space now occupied by the piston 40 out of the orifice. The mass of ejected material is controlled by the diameter of the piston 40, the length of the stroke, and the density of the material and the time of actuating the coil 35. With these control variables, a very uniform, tightly controlled mass of material per unit time is delivered from the chamber 30 to the vaporization zone 10. This degree of control is important to the manufacture of thin-film layers using evaporative sources. By appropriate manipulation of these control variables, the delivery rate of material can vary over a wide range. The mass per unit time can be constant or varied over time depending on the desired nature of the deposited film.

Figure 3:
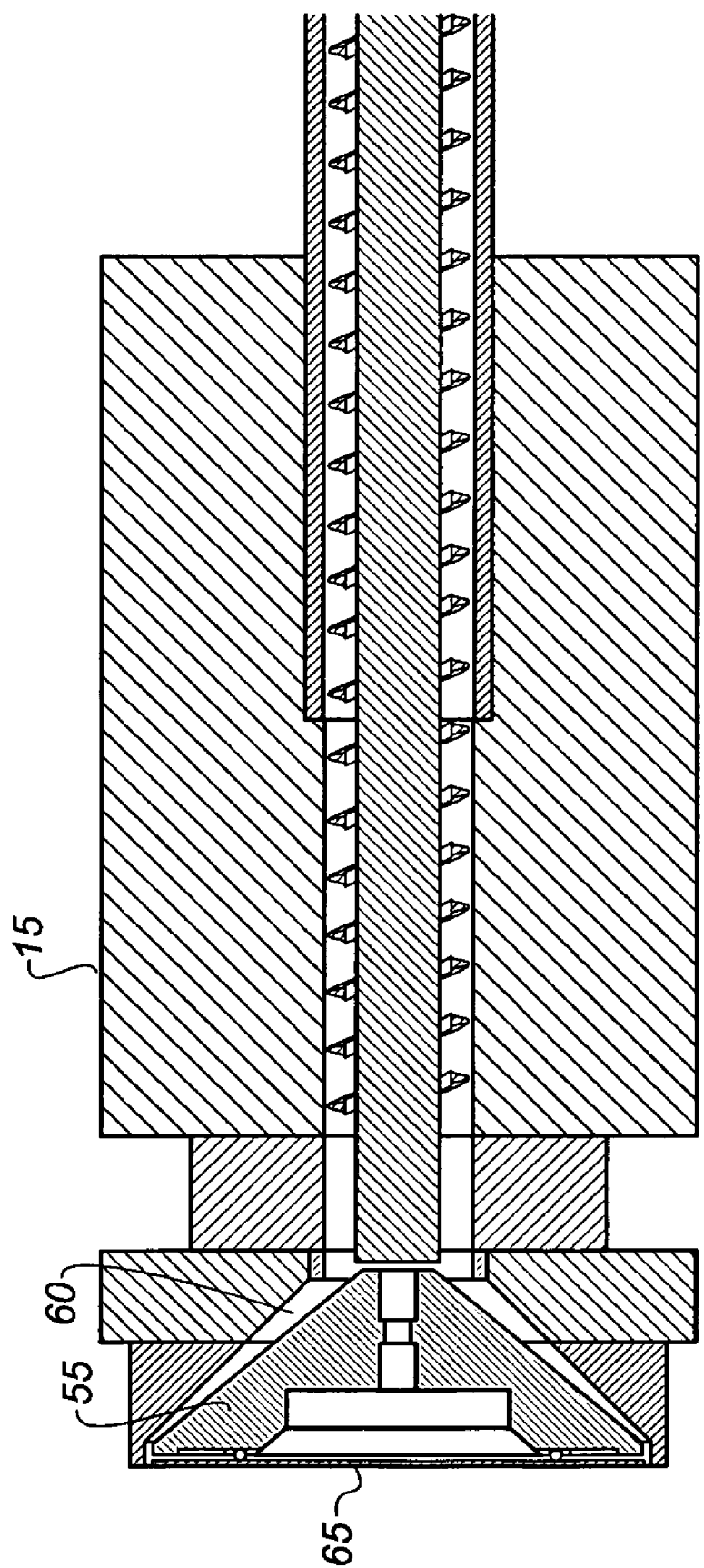
FIG. 3 is a cross-section view of an alternative embodiment of the invention.

FIG. 3 is a cross-section of an alternative embodiment of the invention. This embodiment is circularly symmetric. In this embodiment, the screw mechanism 15 feeds material from the container 5 against a spreader 55. The spreader 55 is conically shaped and expands the diameter of delivered material from the screw mechanism 15 driving the material through the material channel 60. A piezo-actuated vibratory diaphragm 65 is attached to the spreader 55. On the inward stroke, the diaphragm 65 displaces material in the material channel 60, forcing the material to flow around the diaphragm 65. On the outward stroke, the material that has flowed around the diaphragm 65 is directed to the heated plate 25 (see FIG. 1) for flash vaporization of the material.

The invention has been described in detail with particular reference to certain preferred embodiments thereof, but it will be understood that variations and modifications can be effected within the spirit and scope of the invention.

PARTS LIST

5 Container
10 Vaporization zone
15 Screw mechanism
20 Positive displacement mechanism
25 Heated plate
30 Chamber
35 Electrical coil
40 Piston
45 Vibratory diaphragm
50 Orifice
55 Spreader 60 material channel
65 Vibratory diaphragm
70 Positive displacement plate

The invention claimed is:

1. Apparatus for vaporization of powdered or granular material, comprising:
   (a) a container for holding powdered or granular material having at least one component;
   (b) a vaporization structure; and
   (c) a positive displacement mechanism spaced from the vaporization structure defining a chamber for receiving powdered or granular material from the container, and delivering such powdered or granular material to the vaporization structure, the positive displacement mechanism defining an orifice for delivering powdered or granular material from the chamber to the vaporization structure, an actuable member movable in first and second directions into the orifice and back from the orifice respectively therefrom for driving powdered or granular material from the chamber through the orifice for delivery to the vaporization structure and a vibratory diaphragm for fluidizing material in the chamber between the actuable member and the orifice.

2. The apparatus of claim 1 wherein the positive displacement mechanism includes a piston and wherein the repetition rate of the piston is selected to cause the fluidized material to be delivered through the orifice towards the vaporization structure.

3. The apparatus of claim 1 wherein the repetition rate of the piston is controllable.

4. The apparatus of claim 2 wherein the positive displacement mechanism includes an electrical coil, the actuable member is a metallic piston and current flows through the electrical coil causes forces to be exerted on the piston.

5. The apparatus of claim 1 wherein the vaporization structure includes a heated plate for vaporizing material.

* * * * *